United States Patent [19]

Nakajyo et al.

[11] 4,170,524

[45] Oct. 9, 1979

[54] METHOD OF PARTIALLY PLATING ARTICLE OR SYNTHETIC RESIN

[75] Inventors: Noriaki Nakajyo, Tokyo; Toshihiko Uchiyama, Yokohama, both of Japan

[73] Assignees: Nissan Motor Company, Ltd.; Kokoku Rubber Industry Company, Ltd., both of Japan

[21] Appl. No.: 809,713

[22] Filed: Jun. 24, 1977

[30] Foreign Application Priority Data

Jun. 25, 1976 [JP] Japan ................................ 51-74399

[51] Int. Cl.$^2$ .......................... C25D 5/02; C25D 5/56

[52] U.S. Cl. ........................................ 204/15; 204/20; 204/30

[58] Field of Search ............................ 204/20, 30, 15; 156/150

[56] References Cited

U.S. PATENT DOCUMENTS

| | | | |
|---|---|---|---|
| 3,416,992 | 12/1968 | Amos | 156/150 |
| 3,441,487 | 4/1969 | Rea et al. | 204/4 |
| 3,591,352 | 7/1971 | Kennedy et al. | 204/20 |
| 3,640,789 | 2/1972 | Hepfer | 156/150 |
| 3,853,714 | 12/1974 | Shimada et al. | 204/4 |

*Primary Examiner*—T. M. Tufariello

[57] ABSTRACT

Partial plating of a synthetic resin article is accomplished with a beautiful appearance and good adhesion of the plated coating regardless of the shape and size of the article or geometry of the intended coating by a method having the steps of (a) producing an article to be plated by uniting a first member, or members, of a conducting resin with a second member, or members, of a nonconducting resin such that the surface of the first member in the produced article is partially exposed and that the exposed portion of the surface alone gives a region, or regions, to be plated, (b) forming a metal coating exclusively on the exposed portion of the first member by chemical plating, and (c) effecting electroplating on the metal coating.

4 Claims, 5 Drawing Figures

METHOD OF PARTIALLY PLATING ARTICLE OR SYNTHETIC RESIN

BACKGROUND OF THE INVENTION

This invention relates to a method of partially plating a synthetic resin article.

A metal coating can be formed on an article made of a synthetic resin by electroless or chemical plating, though the metal must be selected among only a few kinds. For synthetic resin articles, it is frequently required that only a specific region (or regions) of each article be plated with a metal for an ornamental purpose, for example, but the requirement cannot easily be met in industrial production.

The most familiar technique for accomplishing partial plating of a synthetic resin article is a masking method, wherein areas not to be plated are coated with a certain material which prevents the deposition of a metal thereon by chemical plating. The masking material is usually a resin-base paint or ink. This method has the shortcoming that a significant discoloration of the antideposition coating occurs as the result of an oxidizing acid treatment of the article by an etching procedure preparatory to a chemical plating operation. Besides, the deposited metal is liable to exhibit a significant accumulation along the boundary between the plated coating and the anti-deposition coating and/or irregularly spread across the boundary. Accordingly the plated article suffers from insufficient precision in the geometry of the plated coating and/or unsatisfactory ornamental effect, and the cost of plating is relatively high due to a large number of unacceptable products.

As an alternative to a partial plating technique it is known to initially form a metal coating by chemical plating on the entire surface of the article and then cover the unwanted region of the plated coating with a nonmetallic paint. This method too has some disadvantages such as the waste of the metal material, relatively high cost, peeling tendency of the nonmetallic coating due to its insufficient adhesion to the plated coating, and a low wear resistance of the non-metallic coating.

In some cases, a local coating of a synthetic resin article with a metal layer is accomplished by a hot-stamping technique. However, this technique is not always applicable to variously shaped articles. Besides, a metal coating formed by this method is inferior in durability to a coating formed by chemical plating.

The appearance of a chemically plated coating will be improved by performing electroplating on this coating. In this case the article must be connected to the anode of an electroplating apparatus at a point on the chemically plated coating, and every region to be plated must be connected to this point. Accordingly this method is impracticable when the plating of either a plurality of discontinuous regions or only a middle region of a definite surface is required.

Synthetic resins can be rendered conductive by dispersing therein a finely divided conducting material such as carbon black. It seems possible to effect electroplating directly on a resin article by using a conductive resin as the material of the article. However, this idea has not been realized, at least industrially, since the values for the intrinsic specific resistance of currently available conducting resins are too large to accomplish electroplating on these resins. The specific resistance can be decreased by increasing the amount of the conducting material added to the basic resin. However, a conducting resin containing a large amount of a conducting material is quite unsatisfactory in its fluidity at shaping operations and, besides, loses toughness and/or elastomeric character in a shaped state. At present it is difficult to obtain a conducting resin which has a specific resistance small enough to the accomplishment of a direct electroplating thereon and nevertheless retains good physical properties required for a resin as a moldable structural material.

SUMMARY OF THE INVENTION

It is an object of the present invention to provide a method of partially plating a synthetic resin article, which method is fully practicable at moderate costs regardless of the shape and size of the article or the design of the areas to be plated.

It is another object of the invention to provide a method of partially plating a synthetic article, which method gives a plated coating of excellent appearance, good adhesion and high precision in its plan view geometry.

It is still another object of the invention to provide a method of partially plating a synthetic resin article, which method is useful even when it is intended to effect electroplating on two or more discontinuous regions of the article and/or a region which is completely surrounded by another region not to be plated.

A partial plating method according to the invention comprises the following steps: (a) producing an article to be plated by uniting at least one first member which is made of a conducting synthetic resin with at least one second member which is made of a nonconducting synthetic resin such that the surface of said at least one first member in the article is partially exposed and that the exposed portion of the surface alone gives a region or regions to be plated; (b) forming a metal coating exclusively on the exposed portion of the surface by a chemical plating procedure; and (c) effecting electroplating on the metal coating.

In this method it is required that the conducting resin member alone be plated at the step (b). We have confirmed that, when a conducting resin and a nonconducting resin are simultaneously subjected to a usual chemical etching process as a preparatory operation to chemical plating, the conducting resin is more susceptible to an etching solution (oxidizing acid solution) and that the aforementioned requirement can surely be met by the employment of an appropriately moderate etching condition at the step (b). We have recognized also that a remarkable decrease in the surface resistance of the conducting resin member results from the acid treatment for etching and that the surface resistance and, hence, a practical resistance of the conducting resin member itself exhibit a further decrease when chemical plating is accomplished on the etched surface. The electroplating at the step (c), therefore, can smoothly be accomplished to give an excellent product.

To form metal coatings of good appearance by a method according to the invention, proper care should be given to the maximum distance between a point of the conducting resin member at which the member is connected to the anode of an electroplating apparatus and the exposed surface to be plated, as will hereinafter be described in detail.

DESCRIPTION OF PREFERRED EMBODIMENTS

EXAMPLE 1

Figure 1:
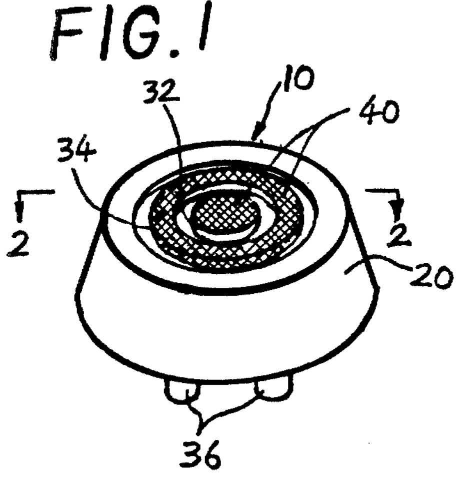
FIG. 1 is a perspective view of a synthetic resin article which is partially plated by a method according to the invention.
Figure 2:
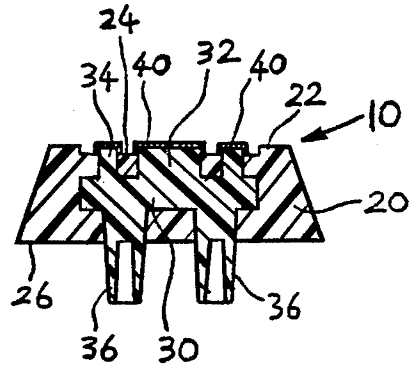
FIG. 2 is a sectional view of the article of FIG. 1.

A synthetic resin article shown in FIGS. 1 and 2 would be taken as an emblem for the attachment to, for example, automobiles. This article 10 takes the form of a single solid body but is composed of two members: a primary member 20, which is made of a nonconducting synthetic resin and has the shape of a truncated cone, and a secondary member 30 which is of a conducting resin given by dispersing a finely powdered conducting material in a synthetic resin and is mostly embeded in the primary member 20. In this example the material of the primary member 20 was polystyrene resin, and the conducting resin as the material of the secondary member 30 was acrylonitrile-butadiene-styrene (ABS) resin containing carbon black dispersed therein. The amount of carbon black in the ABS resin was such that this conducting resin had a specific resistance of about 100 ohm-cm.

The secondary member 30 was produced by injection molding, and the primary member 20 was shaped with the insertion of the secondary member 30 in a mold.

The secondary member 30 of FIG. 2 has fundamentally the shape of a disc. A cylindrical projection 32 and an annular projection 34 which encircles former projection 32 are formed on one side of the disc. On an upper (truncated) end face 22 of the primary member 20 is formed a shallow and circular recess 24, and the protruded end portions of the projections 32 and 34 of the secondary member 30 appear in this recess 24. (In FIGS. 1 and 2 these portions of the projections 32, 34 are illustrated as already covered with metal coatings 40 which are plated by a series of procedures described hereinafter.) On the other side of the conducting resin disc 30 are formed a pair of elongate projections 36, which protrude from the base 26 of the frust-conical member 20 so as to serve as electric terminals at the hereinafter described electroplating procedure.

In this example, the elongate projections 36 had such a length that the longest electrical conduction distance between the ends of the elongate projections 36 and the exposed surfaces of the cylindrical and annular projections 32, 34 was 6 cm.

The metal coatings 40 were formed by the following plating procedures.

The article 10 (the united members 20 and 30) was firstly immersed in a chemical etching solution, which was prepared by mixing a 350 g/l sulfuric acid solution with the same volume of a 400 g/l chromium trioxide solution, at 70° C. for 2 min. Then the article 10 was immersed in a sensitizing solution, which was a 10 g/l stannous chloride solution, for 3 min and subsequently in an activating solution, in which was dissolved 1 g/l of palladium chloride, for 3 min.

Figure 3:
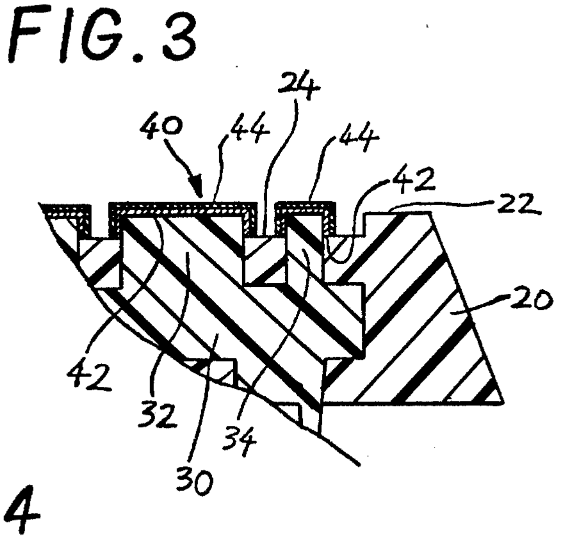
FIG. 3 is a fragmentary enlargement of FIG. 2.

The thus treated article 10 was immersed in a conventional chemical nickel plating bath so as to deposit nickel on the exposed surfaces of the cylindrical and annular projections 32 and 34 of the conducting resin member 30. As a result, the surfaces of the projections 32 and 34 in the regions protruding from the upper end face 22 of the primary member 20 were entirely and intimately covered with chemically deposited nickel coatings as indicated at 42 in FIG. 3.

In a method according to the invention, the deposition of nickel on (or chemical plating of) any surface of the nonconducting resin member 20 is precluded by moderate chemical etching, sensitizing and activating treatments compared with analogous treatments commonly done for chemical plating of nonconductive resins. The successive treatment of the article 10 with the etching, sensitizing and activating solutions, particularly the treatment with the etching solution, is completed in shorter immersion time compared with the same treatment in conventional chemical plating methods for nonconducting resins. The shortening of the immersion time for completing the surface treatment does not hinder the deposition of nickel on the conducting resin member 30 because this type of resins is more susceptible to an oxidizing acid solution than nonconducting resins are. The goal of chemically depositing nickel exclusively on the surfaces of the conducting resin member 30 can primarily be gained by limiting the immersion time in the etching solution to 1-2 min. Preferably, the concentration of the stannous chloride solution is between 1 and 10 g/l, while the concentration of the palladium chloride solution between 0.5 and 10 g/l. The immersion time in each of the sensitizing and activating solutions is preferably limited to a few minutes.

The chemically nickel plated article 10 was subjected to the following electroplating procedures in the sequence of (1)→(2)→(3). In these procedures, the elongate projections 36 were electrically connected to the anode of the plating apparatus.

(1) Copper plating
Bath composition:
  Copper sulfate: 250 g/l
  Sulfuric acid: 50 g/l
  Brightener: 2.5 ml/l
Bath temperature: 20°-25° C.
Current density: 2-3 A/dm$^2$
Current efficiency: 97%

(2) Nickel plating
Bath composition:
  Nickel sulfate: 300 g/l
  Nickel chloride: 50 g/l
  Boric acid: 50 g/l
  Brightener: 12 ml/l
Bath temperature: 50°-60° C.
Current density: 3-6 A/dm$^2$
Current efficiency: 95%

(3) Chromium plating
Bath composition:
  Chromium trioxide: 200 g/l
  Sulfuric acid: 1 g/l
Bath temperature: 40° C.
Current density: 5-15 A/dcm$^2$
Current efficiency: 16%

As a result, the chemically deposited nickel layers 42 were entirely laid with electroplated coatings 44 (in FIG. 3) with chromium on the outer surface. No metal deposition occured on any surface of the nonconducting resin member 20. The electroplated coatings 44, i.e., the coatings 40, had a splendorous appearance and exhibited an adhesion strength of 1.2 kg/cm$^2$.

EXAMPLE 2

Figure 4:
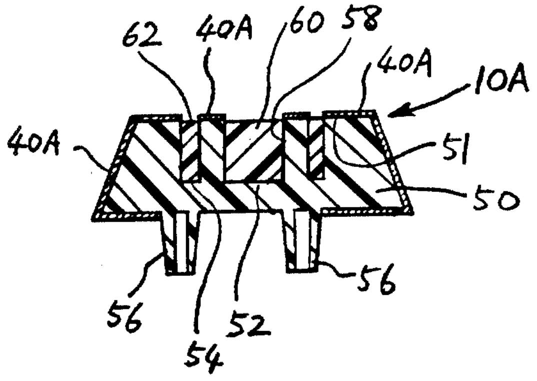
FIG. 4 is a sectional view of another synthetic resin article as a variation of the article of FIGS. 1-2.

FIG. 4 shows a synthetic resin article 10A which was produced and partially plated in Example 2. This article 10A is made up of a primary member 50 of a conducting resin and two pieces of secondary members 60 and 62 which are both embeded in the primary member 50 in the following manner. The primary member 50 has the shape of a truncated cone. A cylindrical recess 52 is formed in a central region of the upper (truncated) end face 51 of the primary member 50, and an annular recess 54 is formed on the same end face 51 so as to encircle the cylindrical recess 52 with a distance therebetween. A first piece 60 of the secondary members takes the form of a solid cylinder which entirely and just fills in the cylindrical recess 52. The other piece 62 of the secondary members is a ring which entirely and just fills in the annular recess 54. The primary member 50 has a pair of elongate projections 56 formed on its base face to utilize at an electroplating procedure.

The primary member 50 was made of ABS resin containing carbon black dispersed therein in such an amount that the specific resistance was 50 ohm-cm, and the secondary members 60, 62 were of acrylonitrile-acryl-styrene (AAS) resin.

This article 10A was partially plated such that metal coatings 40A were formed on the following areas: (a) a peripheral region of the upper end face 51 defined between the periphery and the annular recess 54, (b) an annular region interposed between the two recesses 52 and 54 (the upper end face of an annular wall 58 resulting from the provision of the two recesses 52, 54), (c) the entire side face, and (d) a majority of the base (excluding small areas occupied by the projections 56). The projections 56 were designed such that the longest conduction distance between their ends and the coatings 40A was not longer than 6 cm.

The primary and secondary members 50, 60, 62 were united as illustrated prior to the plating operations. Then the article 10A was subjected to the surface treatment and the chemical plating procedure of Example 1 to accomplish the deposition of nickel on the above described surfaces (a)-(d). On the chemically deposited nickel layers copper, nickel and chromium were sequentially deposited by the electroplating procedures of Example 1. The intended areas were entirely and uniformly plated by these procedures while no deposition of any metal occurred on the exposed surfaces of the secondary members 60, 62. The apperance of the plated coatings 40A was quite splendorous. The coatings 40A in this example exhibited an adhesion strength of 0.9 kg/cm$^2$.

The projections 36 or 56 are formed at locations with substantial distances from the regions to be plated through the interior of the conducting member resin member 30 or 50.

Figure 5:
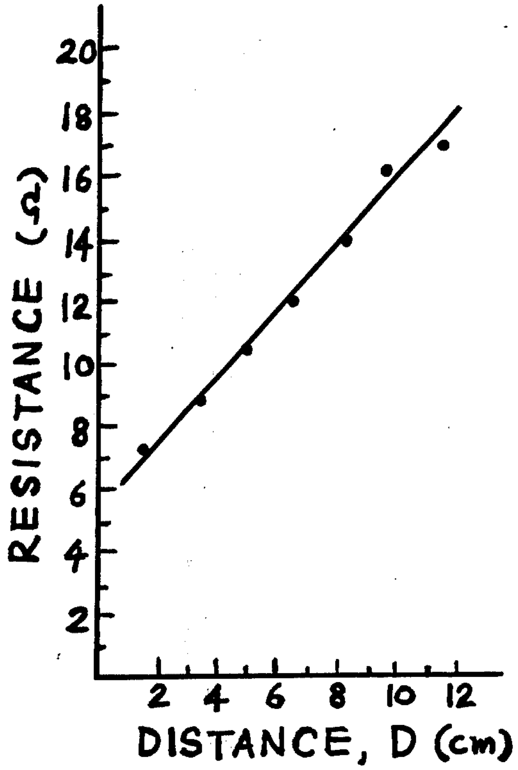
FIG. 5 is a graph, with regard to a strip of a conducting resin with a chemically plated coating on one of its narrower side faces, showing the relationship between the distance from the plated surface and the electric resistance.

A careful consideration should be given to a distance (in the sense of a current path) between the electric terminal (a point close to the end of either of the two projections 56 in Example 2) on the conducting resin portion of the article to be plated and the remotest (from the terminal) point on the surfaces to be plated. An electroplated coating may not have a good appearance or brightness if this distance is undully long. For example, an experiment on strips of the conducting resin employed in Example 2 (the intrinsic specific resistance was 50 ohm-cm) gave the results as shown below in the table. In this experiment, a nickel coating was formed by chemical plating on one end face of each strip, followed by the electroplating procedures of Example 1 for sequentially depositing copper, nickel and chromium on the chemically plated coating. In the table, Distance L means the linear distance between the aforementioned end face of the strip and a point close to the other end face, at which the strip was connected to the anode of the plating apparatus. In the electroplating operation, the copper plating, nickel and chromium plating were performed respectively for 10 min, 5 min and 1 min. The resistance of the strip measured after the chemical plating as the function of the distance L is shown also in FIG. 5.

| | Resistance (ohm) | | Appearance of electro-plated coating | | |
|---|---|---|---|---|---|
| Distance L (cm) | Before chem. plating | After chem. plating | Cu-plating | Ni-plating | Cr-plating |
| 1.5 | 50 | 7.2 | bright | bright | good |
| 3.5 | 55 | 8.8 | " | " | " |
| 5.0 | 55 | 10.5 | " | " | " |
| 6.5 | 60 | 12 | " | " | no good |
| 8.3 | 65 | 14 | " | " | " |
| 9.7 | 65 | 16 | a little cloudy | a little cloudy | " |
| 11.5 | 70 | 17 | dull | dull | " |

In general, the distance L can be made longer as the current efficiency (the ratio of the quantity of an actually deposited metal to the theoretical quantity according to Faraday's Law) enhances. We have experimentally confirmed that metal coatings electroplated according to the invention on conducting resins are satisfactory both in their appearance and in adhesion strength when the distance L is made as follows in dependence on the current efficiency E.

| Current efficiency E | Distance L |
|---|---|
| $90 \leqq E$ | $D \leqq 15$ cm |
| $50\% \leqq E < 90\%$ | $D \leqq 8$ cm |
| $20\% \leqq E < 50\%$ | $D \leqq 7$ cm |
| $E < 20\%$ | $D \leqq 6$ cm |

It will be considered to raise the voltage for an electroplating operation in this method as a remedy for a low current efficiency as shown in Example 1 with regard to the chromium plating. However, this is impractical in the plating of a resin since the employment of unduly high voltages causes a considerable rise in temperature of the resin in a portion near the electric terminal such as the projections 36 in FIG. 1 and results in scorching of the resin in such portion.

It will be apparent that a method of the invention is applicable to articles made of any conventional synthetic resin useful as a structural material. Polystyrene resin and polypropylene resin are typical examples of resins useful as the basic material of the conducting part of the articles in addition to ABS resin employed in Example 1. Of course there is practically no restriction to the shape and size of the articles to be plated and the kind of the metal to be deposited by electroplating (insofar as an electroplating method is known for the metal). It should be understood that the two projections 36 (or 56) may be replaced with a differently designed single projection and that the provision of a projection or projections principally for use as an electric terminal is not an indispensable requisite to a method of the invention. If the article to be plated inherently has a projection which can conveniently be used as the terminal, there is no need of forming an extra projection for electrical connection.

What is claimed is:

1. A method of partially plating an article of synthetic resin such that the plated portion of the article has at least one region which is completely surrounded by a non-plated region in a plan view of the article, the method comprising the steps of:

(a) producing an article to be plated by uniting at least one first member of a conducting synthetic resin with at least one second member of a non-conducting synthetic resin such that a first portion of the outer surface of said first member in said article is exposed to give entire regions of said article to be plated, including at least one region which is completely surrounded by said non-conducting synthetic resin, and that a second portion of the outer surface of said first member is exposed in a region of said article not to be plated and located remote from said at least one region;

(b) forming a metal coating selectively exclusively on said first portion by a chemical plating procedure; and (c) selectively electroplating only in the areas of metal coating, by utilizing said second portion as an input electrical terminal for the electroplating.

2. The method of claim 1, in which a mild chemical etching solution is applied to the surfaces of said article prior to chemical plating to render the surface areas of the conductive portion only receptible to said chemical plating.

3. The method of claim 1, in which the conducting resin is ABS.

4. The method of claim 1, in which electrical connection is made through a second portion which is shaped as at least one projection from the body of the remainder of the article.

* * * * *